United States Patent
Nakatsu

(10) Patent No.: US 9,774,169 B2
(45) Date of Patent: Sep. 26, 2017

(54) SEMICONDUCTOR LASER ELEMENT AND METHOD OF MANUFACTURING SEMICONDUCTOR LASER ELEMENT

(71) Applicant: NICHIA CORPORATION, Anan-shi, Tokushima (JP)

(72) Inventor: Yoshitaka Nakatsu, Komatsushima (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 15/363,712

(22) Filed: Nov. 29, 2016

(65) Prior Publication Data
US 2017/0155230 A1    Jun. 1, 2017

(30) Foreign Application Priority Data

Nov. 30, 2015 (JP) ................................. 2015-232583
Sep. 16, 2016 (JP) ................................. 2016-181721

(51) Int. Cl.
*H01S 5/34*        (2006.01)
*H01S 5/30*        (2006.01)
*H01S 5/343*      (2006.01)

(52) U.S. Cl.
CPC ............ *H01S 5/3409* (2013.01); *H01S 5/305* (2013.01); *H01S 5/3407* (2013.01); *H01S 5/34333* (2013.01)

(58) Field of Classification Search
CPC ........ H01S 5/3407; H01S 5/305; H01S 5/343; H01S 15/34333; H01S 5/2031; H01L 29/242; H01L 2924/1067

(Continued)

(56) References Cited

U.S. PATENT DOCUMENTS

2002/0171092 A1    11/2002   Goetz et al.
2004/0051107 A1    3/2004    Nagahama et al.
(Continued)

FOREIGN PATENT DOCUMENTS

JP        H11-068158 A     3/1999
JP        2002-299685 A    10/2002
(Continued)

*Primary Examiner* — Tuan Nguyen
(74) *Attorney, Agent, or Firm* — Foley & Lardner LLP

(57) ABSTRACT

A semiconductor laser element includes an n-side semiconductor layer, an active layer, and a p-side semiconductor layer, layered upward in this order, each being made of a nitride semiconductor. The active layer includes one or more well layers, and an n-side barrier layer located lower than the one or more well layers. The n-side semiconductor layer includes a composition-graded layer located in contact with the n-side barrier layer. The composition-graded layer has a band-gap energy that decreases toward an upper side of the composition-graded layer, with a band-gap energy of the upper side being smaller than a band-gap energy of the n-side barrier layer. The composition-graded layer has an n-type dopant concentration greater than $5 \times 10^{17}/cm^3$ and less than or equal to $2 \times 10^{18}/cm^3$. The n-side barrier layer has an n-type dopant concentration greater than that of the composition-graded layer and a thickness smaller than that of the composition graded layer.

20 Claims, 10 Drawing Sheets

(58) Field of Classification Search
USPC .................................................. 251/101, 43
See application file for complete search history.

(56) References Cited

U.S. PATENT DOCUMENTS

| | | |
|---|---|---|
| 2005/0127391 A1 | 6/2005 | Yanamoto |
| 2006/0131558 A1* | 6/2006 | Sato ..................... B82Y 20/00 257/17 |
| 2010/0189148 A1 | 7/2010 | Kyono et al. |
| 2015/0229105 A1 | 8/2015 | Masui |

FOREIGN PATENT DOCUMENTS

| | | |
|---|---|---|
| JP | 2002-335052 A | 11/2002 |
| JP | 2003-115642 A | 4/2003 |
| JP | 2003-273473 A | 9/2003 |
| JP | 2009-200437 A | 9/2009 |
| JP | 2012-146847 A | 8/2012 |
| JP | 2014-131019 A | 7/2014 |

* cited by examiner

SEMICONDUCTOR LASER ELEMENT AND METHOD OF MANUFACTURING SEMICONDUCTOR LASER ELEMENT

CROSS-REFERENCE TO RELATED APPLICATIONS

The present application claims priority to Japanese Patent Application No. 2015-232583, filed on Nov. 30, 2015, and Japanese Patent Application No. 2016-181721, filed on Sep. 16, 2016. The contents of these applications are incorporated herein by reference in their entireties.

BACKGROUND

The present disclosure relates to a semiconductor laser element and method of manufacturing a semiconductor laser element.

In present days, semiconductor laser elements having nitride semiconductors (which hereinafter may be referred to as "nitride semiconductor laser elements") can emit light in an ultraviolet range to a green light range, and are used not only as a light source of optical discs, but also in a wide range of applications. Such semiconductor laser elements may include an n-side cladding layer, an n-side optical guide layer, an active layer, a p-side optical guide layer, and a p-side cladding layer layered, in this order, above a substrate, as described in, for example, Japanese Unexamined Patent Publication No. 2003-273473, and Japanese Unexamined Patent Publication No. 2014-131019.

SUMMARY

Nitride-based semiconductor laser elements are expected to emit light of further longer wavelengths and higher optical characteristics in a long-wavelength range, leading to an expansion in the range of their possible applications. For example, a green laser element configured to emit laser light of a longer wavelength with good laser characteristics can be used in a light source device of a projector.

In a nitride-based semiconductor laser element with quantum well structure having well layers made of nitride semiconductors that contain In, optical confinement to an active layer generally decreases with an increase in laser emission from blue wavelength range to green wavelength range, due to wavelength dispersion of refractive index. This may result in an increase in the threshold current that leads to an increase in the current density at the time of lasing. The greater the current density, the greater the effective transition intervals due to screening of localized state and/or band filling, resulting in a shift in the emission wavelength to a shorter wavelength.

The embodiments include the aspects described below.

A semiconductor laser element includes an n-side semiconductor layer, an active layer, and a p-side semiconductor layer respectively made of a nitride semiconductor and layered upward in this order. The active layer includes one or more well layers and an n-side barrier layer arranged lower than the one or more well layers. The n-side semiconductor layer includes a composition-graded layer arranged in contact with the n-side barrier layer. The composition-graded layer has band-gap energies decreasing upward, with the band-gap energy of upper side being smaller than the band-gap energy of the n-side barrier layer. The composition-graded layer has an n-type dopant concentration in a range between greater than $5\times10^{17}/cm^3$ and not greater than $2\times10^{18}/cm^3$. The n-side barrier layer has an n-type dopant concentration greater than that of the composition-graded layer and a thickness smaller than that of the composition-graded layer.

A method of manufacturing a semiconductor laser element includes adjusting compositions so that band-gap energy decreases upward from a lower side that is a starting side of growing to an upper side that is a finishing side of growing, and supplying a source material of an n-type dopant so that the n-type dopant is added in a concentration in a range of greater than $5\times10^{17}/cm^3$ and equal or less than $2\times10^{18}/cm^3$ to form a composition-graded layer, forming an n-side barrier layer that is in contact with an upper surface of the composition-graded layer and has a band-gap energy greater than the upper surface of the composition-graded layer, and has a greater n-type dopant concentration and a smaller thickness than that of the composition-graded layer, forming one or more well layers, and forming a p-side semiconductor layer above the well layers.

In the semiconductor laser element described above, a threshold current can be decreased which allows emission of laser light of a longer wavelength while suppressing a rise in the voltage.

DETAILED DESCRIPTION

Figure 1:
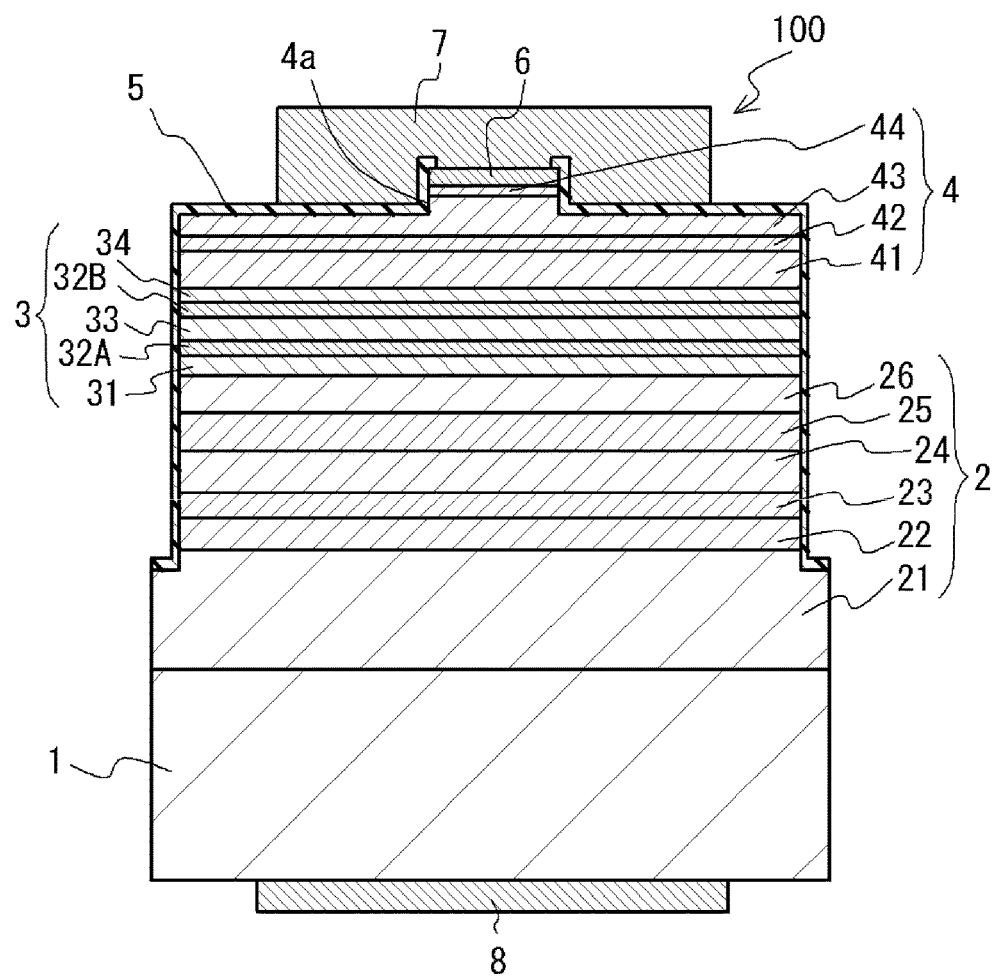
FIG. 1 is a schematic cross-sectional view of a semiconductor laser element according to one embodiment.

Certain embodiments of the present invention will be described below with reference to the drawings. The described embodiments are intended as illustrative of a semiconductor laser element and a method of manufacturing the semiconductor laser element to give a concrete form to technical ideas of the present invention, and the scope of the invention is not limited to those described below. In the description below, the same designations or the same reference numerals denote the same or like members and duplicative descriptions will be appropriately omitted.

Figure 2:
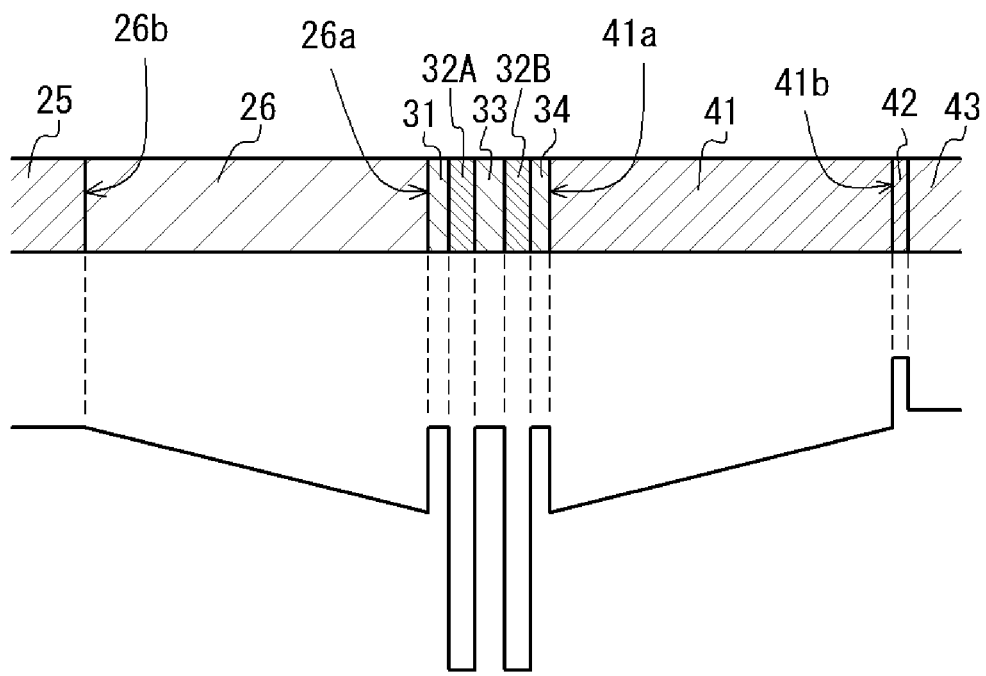
FIG. 2 is a diagram schematically showing band-gap energies at and around an active layer of the semiconductor laser element according to one embodiment.

FIG. 1 is a schematic cross-sectional view of a semiconductor laser element 100 according to a first embodiment, showing a schematic cross-section of the semiconductor laser element 100 in a direction perpendicular to a cavity direction of the semiconductor laser element 100. FIG. 2 is a diagram schematically showing band-gap energies at and around an active layer 3 of the semiconductor laser element 100. The semiconductor laser element 100 includes an n-side semiconductor layer 2, the active layer 3, and a p-side semiconductor layer 4 in this order upward. The n-side semiconductor layer 2, the active layer 3, and the p-side semiconductor layer 4 are respectively made of nitride semiconductors. The active layer 3 includes well layers 32A, 32B and an n-side barrier layer 31 closer to the n-side semiconductor layer 2 than the well layers 32A, 32B. The n-side semiconductor layer 2 includes a composition-graded layer 26 arranged in contact with a lower surface of the n-side barrier layer 31. The composition-graded layer 26 has band-gap energies decreasing upward and in which the band-gap energy at an upper side is smaller than the band-gap energy of the n-side buffer layer 31. In other words, the composition-graded layer 26 has a first surface 26a at an n-side barrier layer 31 side and a second surface 26b opposite side of the first surface 26a, and the band-gap energies of the composition-graded layer 26 decreases from the second surface 26b toward the first surface 26a. The n-type dopant concentration in the composition-graded layer 26 can be greater than $5 \times 10^{17}/cm^3$ and equal to or less than $2 \times 10^{18}/cm^3$. The n-side barrier layer 31 has a greater n-type dopant concentration and a smaller thickness than that of the composition-graded layer 26.

With the configuration as described above, optical confinement in the active layer 3 can be enforced and the lasing threshold current density can be decreased. Accordingly, screening of localized state can be reduced, and a shift in the wavelength to shorter wavelengths associated with an increase in the injection current can be reduced. Further, with the configuration described above, due to the difference in the band-gap between the n-side barrier layer 31 and the composition-graded layer 26, electron concentration near the first surface 26a in the composition-graded layer 26 increases locally. Accordingly, overflow of holes can be further reduced, which allows a reduction of the thickness of the n-side barrier layer 31 provided to reduce overflow of holes, compared to the case absence of such further reduction of overflow of holes. Such a reduction in the thickness of the n-side barrier layer 31, which is a layer having a high concentration of an n-type dopant, allows for a reduction in screening of localized state by electrons originating from the n-side barrier layer 31. Moreover, the reduction in the thickness of the n-side barrier layer 31 allows for an arrangement of the composition-graded layer 26 closer to the active layer 3, so that optical confinement to the active layer 3 can be enforced.

As described above, reduction in the screening of localized state that may lead a shift in the wavelength to shorter wavelengths allows realizing a semiconductor laser element 100 having a lasing wavelength in a longer wavelength region (for example, lasing wavelength of 530 nm or longer). Further, doping the composition-graded layer 26 with an n-type dopant of a relatively low concentration allows for suppressing a rise in the voltage due to the presence of the composition-graded layer 26. Next, a main mechanism will be described below.

Generally, $\Gamma g_{th}$, the product of a confinement factor $\Gamma$ and a threshold gain $g_{th}$, is called the threshold modal gain and represents substantial gain required for overall mode of the laser element. The threshold modal gain is generally expressed by the model formula shown below. In the formula, $\alpha_i$ and $\alpha_m$ respectively represent an average internal loss and a mirror loss. For convenience of explanation, mode distribution is not considered and the average is used.

$$\Gamma g_{th} = \alpha_i + \alpha_m$$

The modal gain $\Gamma g$ increases as the current density increases. It can be understood from the formula shown above, when the material gain g increases and reaches the threshold gain $g_{th}$, and surpassing the internal loss and the mirror loss, lasing is initiated. While lasing, a stationary state $g=g_{th}$ is reached in a laser cavity. In such a stationary state, modal gain monotonically depends on the carrier density. Therefore, the carrier density at and above the lasing threshold current is clamped at the threshold carrier density $N_{th}$. The higher the injection carrier density, the greater the substantial band-gap due to screening of the localized state, and lasing wavelength tends to shift to a shorter wavelength side. If the confinement factor $\Gamma$ is increased and the threshold gain $g_{th}$ is achieved with lower current, both the threshold current density $j_{th}$ and the threshold carrier density $N_{th}$ decrease. Therefore, the injection carrier density can be decreased and the screening of localized state can be suppressed. Thus, lasing at a longer wavelength side can be achieved.

Reduction in the screening of localized state is described above, which can also be applied in a similar manner to reduction in the band-filling effect. That is, a shift to a shorter wavelength may also occur due to a band-filling effect in which quasi-Fermi levels are moved away from the band edges and the effective transition intervals increase, but such a shift can also be reduced by increasing the confinement factor $\Gamma$ to decrease the threshold carrier density.

Figure 3:
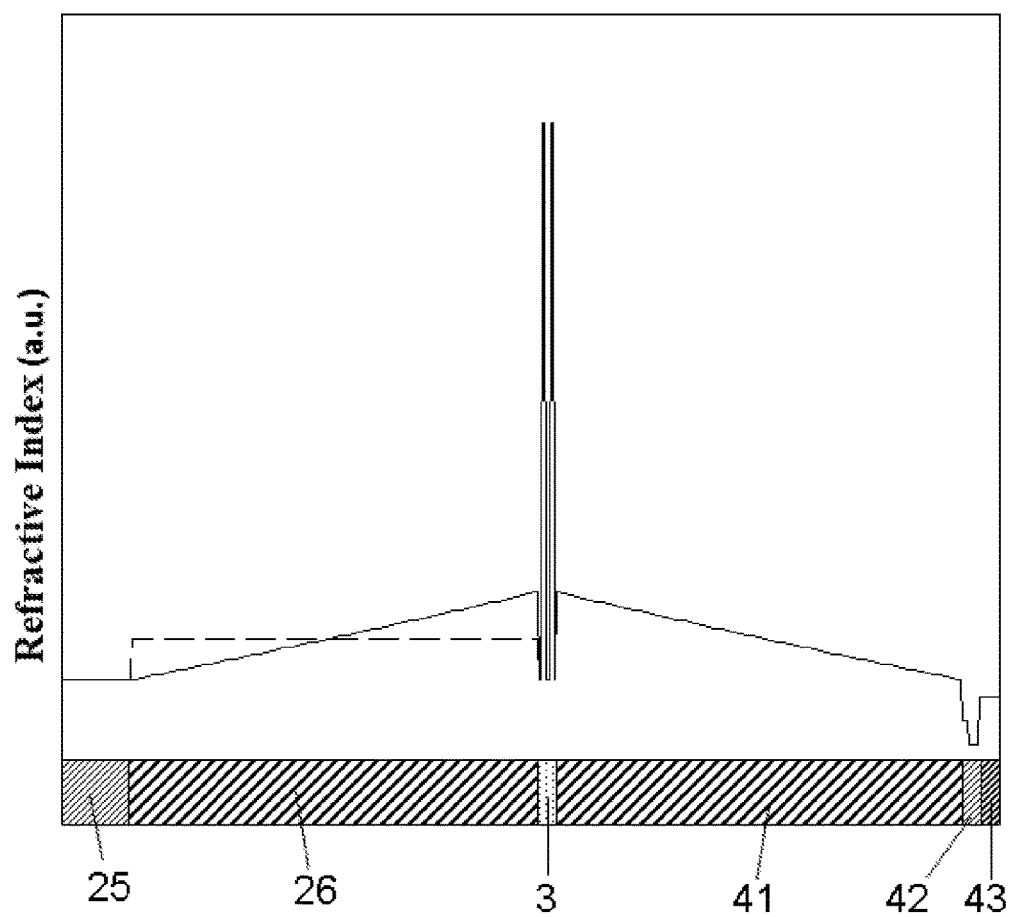
FIG. 3 is a diagram showing refractive index distribution at and around an active layer of the semiconductor laser element according to one embodiment and a comparative semiconductor laser element.
Figure 4:
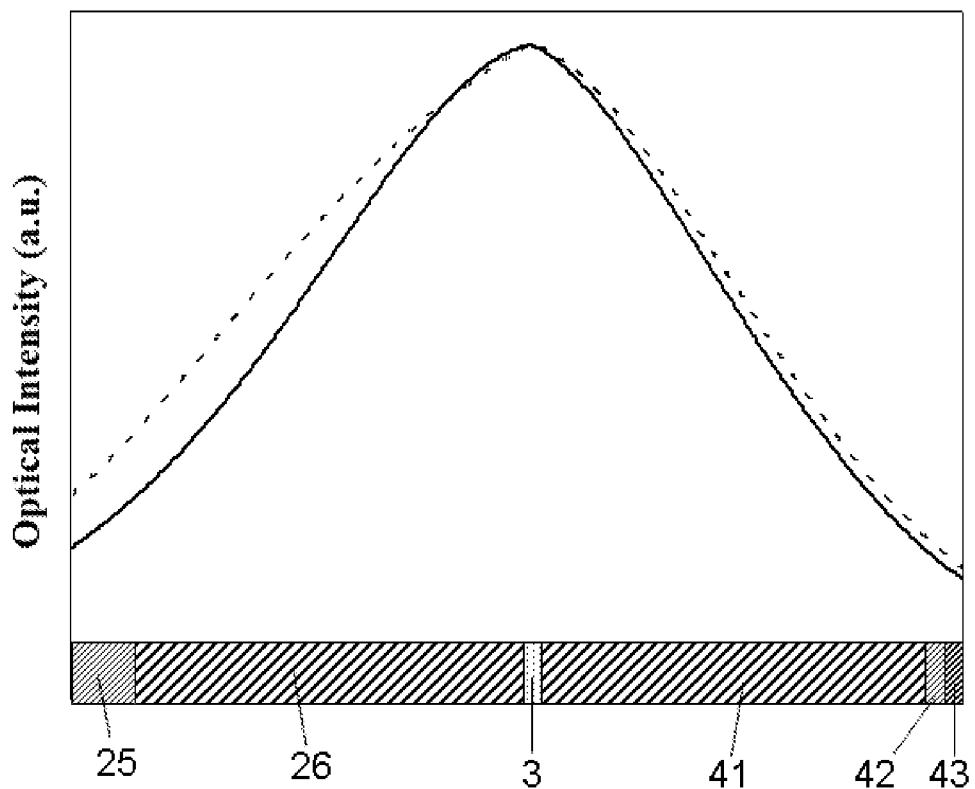
FIG. 4 is a diagram showing an optical intensity distribution at and around the active layer of the semiconductor laser element according to one embodiment and the comparative semiconductor laser element.

Further description will be given below with the use of more specific examples. FIG. 3 is a diagram showing refractive index distribution at and around the active layer 3 of the semiconductor laser element 100, and FIG. 4 is a diagram showing optical intensity distribution at and around the active layer 3. Both of these are graphs plotting calculated values. In FIG. 3 and FIG. 4, the solid lines indicate the semiconductor laser element 100 according to the first embodiment and broken lines indicate a comparative semiconductor element. In FIG. 4, the optical intensity is normalized at the maximum intensity.

The comparative semiconductor laser element differs from the semiconductor laser element 100 according to the first embodiment in that the layer of the comparative semiconductor laser element corresponding to the composition-graded layer 26 according to the first embodiment is undoped and is a non-composition-graded layer. As shown in FIG. 3, the non-composition-graded layer has a substantially uniform composition made of a semiconductor having an average composition of the composition-graded layer 26. The non-composition-graded layer is an undoped layer but does not have a graded composition, so that a significant voltage rise that may occur with an undoped composition-graded layer can be avoided.

As shown in FIG. 4, light spreads in the n-type semiconductor layer side in the comparative semiconductor laser element, but such spread of light can be suppressed in the semiconductor laser element 100 according to the first embodiment. Spreading of light in the n-type semiconductor layer side indicates a reduction in optical confinement to the active layer, which may result in a rise of threshold current. Also, leakage of light to a substrate side may increase, which may lead to degradation in the performance of the semiconductor laser elements. The semiconductor laser element 100 according to the first embodiment includes the composition-graded layer 26, so that optical confinement to the active layer 3 can be enhanced. In other words, adopting the laser element structure according to the first embodiment can increase the optical confinement factor Γ. Accordingly, the threshold carrier density $N_{th}$ can be reduced, and as a result, lasing in a long wavelength can be realized. In addition, optical confinement to the composition-graded layer 26 can also be enhanced. Thus, light leaking from the composition-graded layer 26 to the outside can be reduced. Light leaking from the composition-graded layer 26 to the outside (that is, to a substrate 1 side) may suffer absorption or do not contribute to lasing. Therefore, reduction of such light is assumed to improve the lasing characteristics. As described above, a long lasing wavelength that cannot be produced with an n-side guide layer of single composition becomes possible with the semiconductor laser element 100 according to the first embodiment.

On the other hand, in the case where a composition-graded layer is employed, a rise in voltage due to occurrence of fixed charges may result. In the composition-graded layer, a layer with a small band-gap energy is grown on a layer with a large band-gap energy, which may induce fixed charges near the interface, which increases the height of the barrier to the electrons. A high voltage is required to inject the electrons in the active layer over the high barrier that may result in a substantial increase in the voltage. Even when the composition-graded layer is formed while finely changing the compositions, some degree of lattice mismatch is inevitable, so that occurrence of fixed charges is difficult to prevent completely. For this reason, an n-type dopant is added to the composition-graded layer 26 in the first embodiment. Addition of the n-type dopant allows shielding of the fixed charges. Accordingly, increase in the voltage can be suppressed and lasing at a low operation voltage can be realized. Adding of a dopant in the composition-graded layer 26 may reduce the laser characteristics due to an increase of absorption loss caused by absorption of light by the dopant, but in the first embodiment, the n-type dopant is used at a low concentration. With this arrangement, degradation of laser characteristics can be reduced while suppressing occurrence of abnormal voltage.

As described above, with the semiconductor laser element 100 according to the first embodiment, lasing in a long wavelength range can be achieved while suppressing a shift to shorter wavelength, and moreover, operation at a low voltage can be realized. With such operation at a low voltage can improve reliability of the semiconductor laser element 100.

Each constituent member will be described in detail below.

Semiconductor Laser Element 100

The semiconductor laser element 100 includes a substrate 1 and the n-side semiconductor layer 2, the active layer 2, and the p-side semiconductor layer 4 disposed upward of the substrate 1. A ridge 4a is disposed upward of the p-side semiconductor layer 4. A portion of the active layer 3 that is directly under the ridge 4a and its vicinity is an optical waveguide region. Side surfaces of the ridge 4a and surfaces of the p-side semiconductor layer 4 which are continuous from respective side surface of the ridge 4a may be provided with an insulating film 5. The substrate 1 may be made of an n-type semiconductor and an n-electrode 8 is provided on the lower surface of the substrate 1. A p-electrode 6 is provided in contact with the upper surface of the ridge 4a and a p-side pad electrode 7 is provided on the p-electrode 6. The semiconductor laser element 100 can emit laser light in a long wavelength range and for example, can emit laser light having a wavelength in a range of 530 nm or greater.

Substrate 1

For the substrate 1, a nitride semiconductor substrate made of GaN or the like may be used. Other than such a nitride semiconductor substrate, other semiconductor substrate, an insulating substrate, or the like can be used. Examples of semiconductor substrate include SiC, Si, and GaAs, and examples of insulating substrate include sapphire. The n-side semiconductor layer 2, the active layer 3, and the p-side semiconductor layer 4 may be semiconductors grown substantially in a c-axis direction. For example, using a GaN substrate having c-plane ((0001) plane) as a principle surface, each semiconductor layer can be grown on the c-plane. In the specification, the expression "having c-plane as a principle surface" can include a plane with an off angle of about ±1° with respect to the c-plane. With the use of substrate having a principle surface of c-plane, good mass productivity can be obtained.

N-side Semiconductor Layer

The n-side semiconductor layer 2 can have a multilayer structure made of nitride semiconductors such as GaN, InGaN, AlGaN, and the like. Examples of the n-type semiconductor layer included in the n-side semiconductor layer include a layer made of a nitride semiconductor containing an n-type dopant such as Si, Ge, and the like. The n-side semiconductor layer 2 includes, for example, in order from the substrate 1 side, a first n-type semiconductor layer 21, a second n-type semiconductor layer 22, a third n-type semiconductor layer 23, a fourth n-type semiconductor layer 24, a fifth n-type semiconductor layer 25, and the composition-graded layer 26.

First to Fifth N-type Semiconductor Layers 21 to 25

Each of the first to fifth n-type semiconductor layers contains an n-type dopant. The first n-type semiconductor layer 21 is made of, for example, AlGaN. The second n-type semiconductor layer 22 is for example, a layer having a band-gap energy greater than that of the first n-type semiconductor layer 21. The second n-type semiconductor layer 22 is made of, for example, AlGaN. The third n-type semiconductor layer 23 is made of, for example, InGaN. In the third n-type semiconductor layer 23, a composition ratio of In is smaller than that in the well layers 32A, 32B. The fourth n-type semiconductor layer 24 is for example, a layer having a band-gap energy greater than that of the first n-type semiconductor layer 21, and may have a band-gap energy substantially equal to that of the second n-type semiconductor layer 22. The fourth n-type semiconductor layer 24 is made of, for example, AlGaN. Either the second n-type semiconductor layer 22 or the fourth n-type semiconductor layer 24, or the both may have the greatest band-gap energy in the n-side semiconductor layer 2, and typically serve as n-type cladding layers. The third n-type semiconductor layer 23 can serve as a crack-preventing layer. In this case, the third n-type semiconductor layer 23 preferably has a thickness smaller than that of the second n-type semiconductor layer 22 and the fourth n-type semiconductor layer 24. The fifth n-type semiconductor layer 25 preferably has a band-gap energy smaller than that of the fourth n-type semiconductor layer 24 and equal to or greater than that of a lower end portion of the composition-graded layer 26. For example, the fifth n-type semiconductor layer 25 is made of GaN. The fifth n-type semiconductor layer 25 preferably includes an n-type dopant with a concentration greater than that in the composition-graded layer 26.

Composition-Graded Layer 26

In the composition-graded layer 26, composition is changed stepwise so that the band-gap energy decreases from the second surface 26b toward the first surface 26a. That is, in the composition-graded layer 26, the band-gap energy decreases stepwise from the second surface 26b toward the first surface 26a. Generally, an optical confining structure can be formed by using discontinuity in refractive index at a semiconductor interface. With the composition-graded layer 26 having refractive index increasing stepwise toward the active layer 3, barriers of the optical waveguide can be formed at narrow intervals in the composition-graded layer 26. With this configuration, optical confinement to the active layer 3 can be enhanced. As described above, enhancement of optical confinement to the active layer 3 allows for an improvement in the modal gain to initiate lasing, which can realize lasing under a low threshold current. With a low threshold current, the amount of injection carriers decreases. Accordingly, the carriers to fill the band of the well layers 32A, 32B decrease, so that an increase in the band-gap in the well layers 32A, 32B can be suppressed. Thus, lasing at a long wavelength can be realized.

The well layers 32A and 32B are typically made of InGaN, so that the composition-graded layer 26 is preferably made of $In_aGa_{1-a}N(0<a<1)$ at its upper side (e.g., the first surface 26a side) and $In_bGa_{1-b}N(0\leq b<a)$ at its lower side (e.g., the second surface side 26b). The end at the first surface side 26a of the composition-graded layer 26 is preferably made of InGaN with the composition of In lower than that in the well layers 32A and 32B. The end at the second surface 26b side of the composition-graded layer 26 is for example made of GaN. The composition-graded layer 26 is preferably used for an n-side optical guide layer. The composition-graded layer 26 preferably has an In composition ratio of 0.01 or greater, more preferably 0.03 or greater at a portion proximate to the first surface 26a. Thus, arranging InGaN near the well layers 32A and 32B allows for an improvement in optical confinement to the well layers 32A and 32B. The upper-limit value of In composition ratio a is for example 0.25. In view of reducing deterioration of crystallinity, the composition ratio of In is preferably 0.1 or less.

Figure 5:
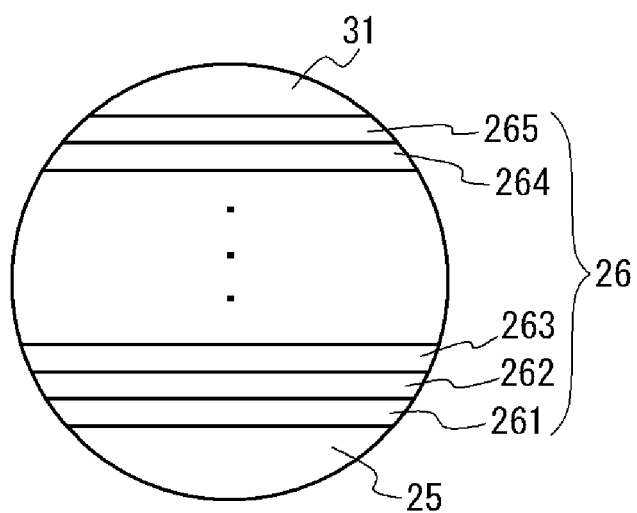
FIG. 5 is a partially enlarged view of a composition-graded layer and its vicinity.

In the composition-graded layer 26, the composition is changed stepwise, so that as shown in FIG. 5, the composition-graded layer 26 can also be referred as a layer made of a plurality of sub-layers 261 to 265 made of $In_xGa_{1-x}N$ each having different compositions. FIG. 5 is a partially enlarged view of the composition-graded layer 26 and its vicinity, showing presence of a plurality of sub-layers other than that described above between the sub-layer 263 and the sub-layer 264. In such a layered structure, difference in lattice constant between adjacent sub-layers is preferably smaller. With a smaller difference in the lattice constant, grid distortion can be reduced and the amount of fixed charge induced by the strain can be reduced. For this reason, in the composition-graded layer 26, the composition is preferably gradually changed for small thicknesses. More specifically, the composition-graded layer 26 has an In composition ratio decreasing every thickness of 25 nm or less from the first surface 26a toward the second surface 26b. That is, each of the sub-layers 261 to 265 preferably has a thickness of 25 nm or less. Further, each of the sub-layers 261 to 265 preferably has a thickness of 20 nm or less. Each of the sub-layers 261 to 265 has a minimum thickness of about one atomic layer (about 0.25 nm). Also, a difference in the In composition ratio x between adjacent sub-layers (for example, between the sub-layer 261 and the sub-layer 262) is preferably 0.005 or less. More preferably, the difference is about 0.001 or less. The minimum value in the difference may be about 0.00007.

Such ranges are preferably satisfied throughout the composition-graded layer 26. In other words, all the sub-layers satisfy such ranges. For example, in the composition-graded layer 26 having a thickness of 230 nm with the lowermost layer made of GaN and the uppermost layer made of $In_{0.065}Ga_{0.935}N$, the layers are grown with conditions to achieve the compositions gradually changed in 120 steps. The number of changes in the composition in the composition-graded layer 26 is preferably 90 or more, more preferably about 120 or more.

At the time of growing the composition-graded layer 26, the increase in the flow ratio of the In source gas with respect to the Ga source gas is preferably adjusted so that the In composition ratio substantially monotonically increases in the forming InGaN. When the flow ratio is monotonically increased from the start to finish of the growing, a monotonic increase of the In composition ratio in the composition-graded layer 26 may be substantially difficult to obtain. Therefore, the increase in the flow ratio of In source gas with respect to the Ga source gas is preferably changed plural times during the growth of the composition-graded layer 26. More specifically, the increase in the flow ratio is preferably increased as the end of the growth approached. The Ga source gas is, for example, triethylgallium (TEG) gas and the In source gas is, for example, trimethylindium (TMI) gas. Also, the flow ratio of the In source gas with respect to the Ga source gas is preferably set so that in a graph plotting In composition ratio calculated from the flow ratio of the TMI gas with respect to the thickness of the composition-graded layer 26, points corresponding to the locations where the flow ratio is changed would substantially lie on a single straight line.

Thus, forming the composition-graded layer 26 with the composition change ratio (that is, a difference in the composition ratio between adjacent sub-layers) substantially constant in an up-down direction allows for substantially uniform distribution of fixed charges. If the effect of suppressing an increase in the voltage can be obtained with a substantially uniform n-type dopant concentration from the second surface 26b to the first surface 26a of the composition-graded layer 26 as described below, the composition change ratio of the composition-graded layer 26 may fluctuate to some degree. For example, in Example 1 below, the change ratio of In composition ratio fluctuates between 0.0002 and 0.0009 but stays in a range of 0.001 or less. The flow ratio etc., of the source gases described above are setting values of the manufacturing device. Each value may be adjusted according to the specification of the manufacturing device.

An n-type dopant is added to the composition-graded layer 26. In the composition-graded layer 26 in which the composition is changed, occurrence of fixed charges is difficult to prevent even with small composition change ratios. For this reason, Addition of the n-type dopant allows shielding of the fixed charges. The minimum concentration of the n-type dopant concentration in the composition-graded layer 26 is preferably such that an increase in the voltage can be sufficiently suppressed, more specifically, $5 \times 10^{17}/cm^3$ or greater is preferable. In the case where the n-type dopant concentration in the composition-graded layer 26 is $5 \times 10^{17}/cm^3$ or less, the fixed charges occurring in the composition-graded layer 26 may not be shielded sufficiently and may result in an increase in the voltage. According to the band calculation, the higher the n-type dopant concentration, the lower the height of the barrier layer, and at the n-type dopant concentration of $5 \times 10^{17}/cm^3$, the height of the barrier layer becomes approximately the same of that in the comparative semiconductor laser element (that has an uniform composition layer in place of the composition-graded layer). Therefore, the n-type dopant concentration is preferably greater than $5 \times 10^{17}/cm^3$. With this concentration, the operation voltage can be reduced to lower than the case employing a uniform composition layer. The n-type dopant concentration is more preferably $7 \times 10^{17}/cm^3$ or greater, and in view of variation in manufacturing, the concentration may be $8 \times 10^{17}/cm^3$ or greater, or further, $1 \times 10^{18}/cm^3$ or greater.

Therefore, the n-type dopant concentration is preferably $2 \times 10^{18}/cm^3$ or less. An increase in the n-type dopant concentration increases absorption loss due to free carriers which may result in a decrease in optical output, but it can be reduced with the n-type dopant concentration equal to or lower than $2 \times 10^{18}/cm^3$. The optical output is assumed to decrease with the n-type dopant concentration of about $2 \times 10^{18}/cm^3$ in the composition-graded layer 26 to a similar degree as a semiconductor laser element that has an undoped composition-graded layer. The n-type dopant concentration in the composition-graded layer 26 may be lower than $2 \times 10^{18}/cm^3$. With an excessive n-type dopant concentration (for example, $1 \times 10^{19}/cm^3$ or greater), flatness of the surface of the semiconductor layer tends to decrease, so that an excessive concentration of the n-type dopant is preferably avoided also from this view point.

The n-type dopant concentration in the composition-graded layer 26 is preferably substantially uniform from the first surface 26a to the second surface 26b. In order to suppress an increase in the voltage, it is sufficient to supply the n-type dopant to the locations where the fixed charges occur. But in the case of the composition-graded layer 26 where the composition is finely graded as described above, it is difficult to accurately supply the n-type dopant to the locations where the composition is graded. Therefore, in order to ensure supply of the n-type dopant to the locations where the fixed charges occur, the concentration of the n-type dopant is preferably uniform from one side to the other side in the thickness direction of the composition-graded layer 26. Also, it is preferable that the composition change ratio in the composition-graded layer 26 is substantially uniform. In other words, the composition is preferably changed so that the band-gap energy monotonically decreases from the second surface 26b to the first surface 26a. If the composition-graded layer 26 has a substantially uniform composition change ratio, distribution of occurring fixed charges would be substantially uniform. Accordingly, with the n-type dopant contained at a substantially uniform concentration, the effect of suppressing an increase in the voltage can be obtained approximately uniformly throughout the thickness direction. To obtain a substantially uniform n-type dopant concentration, for example, setting value of flow ratio of the supply source (e.g., silane gas) of the n-type dopant is maintained substantially uniform from the start to finish of growing the composition-graded layer 26. Note that, in the above-described process, a tolerance in the manufacturing may be allowed. Meanwhile, even in the case where the flow ratio of the source gas of the n-type dopant is maintained substantially uniform, the concentration of the n-type dopant that is incorporated in the composition-graded layer may fluctuate to some degree due to a change in the flow ratio of the In source gas. Also in this case, the n-type dopant concentration in the composition-graded layer 26 can be considered to be substantially uniform.

In order to produce optical confinement effect, the composition-graded layer 26 has a thickness greater than that of the n-side barrier layer 31. More specifically, the composition-graded layer 26 preferably has a thickness of 200 nm or greater. The composition-graded layer 26 has a thickness of preferably about 500 nm or less, more preferably about 300 nm or less. Further, to obtain optical confinement effect, the composition-graded layer 26 is preferably arranged near the active layer 3. More specifically, distance of the composition-graded layer 26 from the well layer 32A is preferably 20 nm or less.

Active Layer 3

The active layer 3 can have a multilayer structure made of nitride semiconductors such as GaN, InGaN and the like. The active layer 3 includes a single quantum well structure or a muiliquantum well structure. To obtain sufficient gain, a multiquantum well structure is preferable. The active layer 3 of a multiquantum well structure has a plurality of well layers 32A and 32B, and an intermediate barrier layer 33 between the well layers 32A and 32B. For example, the active layer 3 includes, in the order from the n-side semiconductor layer 2 side, the n-side barrier layer 31, the well layer 32A, the intermediate barrier layer 33, the well layer 32B, and a p-side barrier layer 34.

For the n-side barrier layer 31, the intermediate barrier layer 33, and the p-side barrier layer 34, semiconductors having band-gap energies greater than that of the well layers 32A and 32B are used. The n-side barrier layer 31, the intermediate barrier layer 33, and the p-side barrier layer 34 are preferably made of InGaN or GaN. This is because the longer the lasing wavelength, the greater the In composition ratios in the well layers 32A and 32B, so that with the use of InGaN or GaN, an excess degree of difference in the lattice constant between those well layers and those barrier layers can be avoided. In the case of semiconductor laser element with a lasing wavelength of 530 nm or greater, the In composition ratios in the well layers 32A and 32B vary to some degree according to the structures of the layer other than the active layer 3, but for example, 0.25 or greater (25% or greater). An upper limit of the In composition ratio in the well layers 32A and 32B can be, for example, 0.50 or less (50% or less). At this time, the lasing wavelength of the semiconductor laser element is assumed to be about 600 nm or less. In view of improvement in crystallinity and/or reduction in optical absorption, the well layers 32A and 32B are preferably undoped. In the present specification, the expression "undoped" exclude intentional doping.

Also, in the analysis results of SIMS analysis etc., a concentration below the detection limit may be referred to as "undoped".

The well layers 32A and 32B may have a thickness of, for example, 4 nm or less, preferably 3 nm or less. Further, layers respectively having a thickness (for example, 1 nm or less) smaller than corresponding barrier layers 31, 33, 34 may be provided between the barrier layers 31, 33, and 34 and their respective corresponding well layers 32A and 32B. In other words, the barrier layers 31, 33, and 34 and their respective well layers 32A and 32B are preferably arranged with a minimum distance (for example, 1 nm or less, inclusive of 0) that is less than the thickness of respective barrier layers 31, 33, and 34.

N-side Barrier Layer 31

The n-side barrier layer 31 has a greater n-type dopant concentration than that in the composition-graded layer 26 and a greater band-gap energy than that of the first surface 26a side of the composition-graded layer 26. With the band-gap energies in such relationship, electrons can be localized near the first surface 26a in the composition-graded layer 26. Accordingly, overflow of the holes can be suppressed even with the n-side barrier layer 31 with a smaller thickness. The n-side barrier layer 31 has a high concentration of the n-type dopant, which may lead to screening of localized state at least in the well layer closest to the n-side barrier layer 31. But this can be suppressed by a reduction in the thickness of the n-side barrier layer 31, allowing for lasing at a longer wavelength. Free carrier absorption may occur due to the n-type dopant and increases optical absorption loss, but this can also be suppressed by the reduction in the thickness, so that optical output can be improved. To localize electrons near the first surface 26a in the composition-graded layer 26, the band-gap energy (that is a smallest band-gap energy in the composition-graded layer 26) of the first surface 26a side of the composition-graded layer 26 is preferably smaller than that in the intermediate barrier layer 33.

More specifically, the n-side barrier layer 31 preferably has a thickness of 20 nm or less. Further, the n-side barrier layer 31 has a thickness of preferably about 15 nm or less, more preferably about 6 nm or less. Also, the n-type dopant concentration in the n-side barrier layer 31 is preferably $1 \times 10^{19}/cm^3$ or greater, more preferably $3 \times 10^{19}/cm^3$ or greater. The n-side barrier layer 31 is a first barrier layer to the electrons in the active layer 3, so that a high concentration of the n-type dopant is preferably contained in the n-side barrier layer 31 to reduce the barrier to the electrons. Moreover, with a high concentration of the n-type dopant in the n-side barrier layer, overflow of the holes can be further reduced. The n-side barrier layer 31 is provided neat the well layer 32A, so that upper limit of the n-type dopant concentration in the n-side barrier layer 31 is preferably a degree not to deteriorate the crystallinity. Also, the n-type dopant concentration in the n-side barrier layer 31 is preferably $5 \times 10^{19}/cm^3$ or lower. Further, the n-side barrier layer 31 is preferably made of GaN so that deterioration of the crystallinity can be suppressed.

Figure 6A:
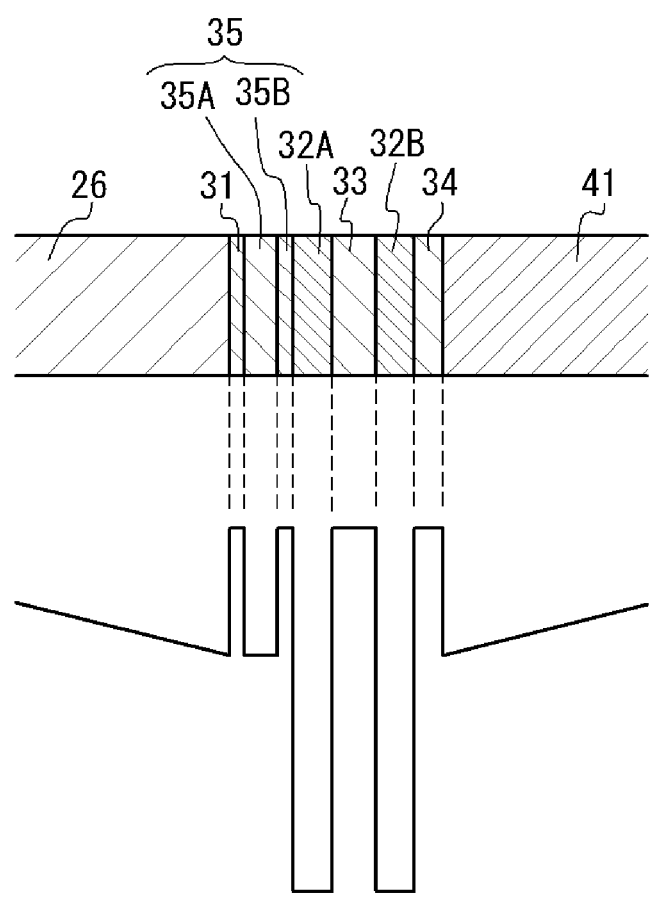
FIG. 6A is a diagram showing an example of an n-side composition-graded layer and its vicinity.
Figure 6B:
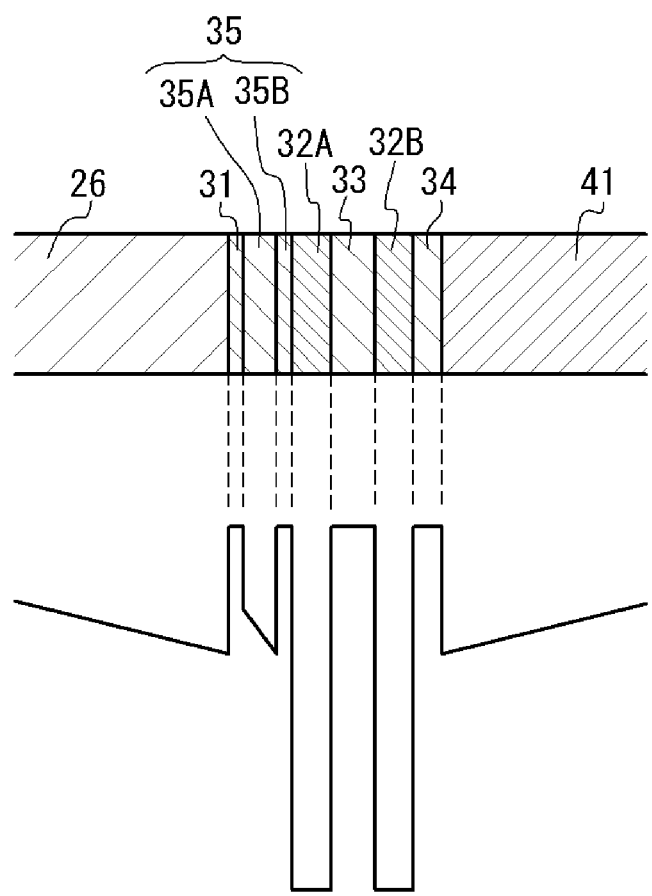
FIG. 6B is a diagram showing another example of an n-side composition-graded layer and its vicinity.

As shown in FIG. 6A, an interposing layer 35 may be provided between the n-side barrier layer 31 and the well layer 32A that is proximate to the n-side barrier layer 31. For example, in order from the n-side barrier layer 31, an interposing layer 35A having a band-gap energy smaller than that of the n-side barrier layer 31 and a second interposing layer 35B having a band-gap energy greater than that of the first interposing layer 35A are provided. As described above, dividing a layer having a large band-gap energy in two layers of the n-side barrier layer 31 and the second interposing layer 35B allows to decrease the thickness of each of the layers. This allows a reduction in the height of the barrier layer to the electrons traveling from the n-side semiconductor layer 2 to the active layer 3, which allows further reduction of operation voltage of the semiconductor laser element 100. Preferably, both the n-side barrier layer 31 and the second interposing layer 35B have thicknesses smaller than that of the first interposing layer 35A. In the case of providing the interposing layer 35, the composition-graded layer 35 and the well layer 32A that is proximate to the composition-graded layer 25 has a minimum distance of, for example, 200 nm or less. In order to facilitate obtaining of optical confinement effect, the first interposing layer 35A preferably has a thickness of about 100 nm or less. An increase in the thickness of the second interposing layer 35B increases influence of piezoelectric field, so that the second interposing layer 35B preferably has a thickness of 10 nm or less. An n-side barrier layer 31 of a greater thickness tends to act as a barrier to electron injection, so that the thickness of the n-side barrier layer 31 is preferably 10 nm or less. Each layer has a thickness of one atomic layer or greater.

The n-side barrier layer 31 and the second interposing layer 35B are preferably thin layers respectively having a thickness smaller than that of the first interposing layer 35A. The second interposing layer 35B preferably contains an n-type dopant, for a similar reason as in the n-side barrier layer 31. With this arrangement, the overflow of the holes can be reduced even with the n-side barrier layer 31 and the second interposing layer 35b respectively having a small thickness. The concentration of the n-type dopant in the second interposing layer 35B can be selected from a similar range as that of the n-side barrier layer 31. If the first interposing layer 35A is an undoped layer, the operation voltage of a semiconductor laser element may increase, so that an n-type dopant is preferably contained in the first interposing layer 35A. In the case where a sum of the thickness of the first interposing layer 35A and the second interposing layer 35B, that is, a total thickness of the interposing layer 35 is 10 nm or less, an n-type dopant is preferably contained in the first interposing layer 35A at a concentration similar to or less than that in the n-side barrier layer 31 and the second interposing layer 35B. For example, a substantially same concentration of the n-type dopant is contained in the n-side barrier layer 31, the first interposing layer 35A, and the second interposing layer 35B, respectively. Contrastingly, in the case where the entire thickness of the interposing layer 35 exceeds 10 nm, if the n-type dopant is contained in the entire interposing layer 35, a decrease in the slope efficiency may result due to an increase in optical absorption and an increase in overflow of electrons. For this reason, when the thickness of the entire interposing layer 35 exceeds 10 nm, a portion of the first interposing layer 35A near the second interposing layer 35B is preferably doped with the n-type dopant while the rest of the first interposing layer 35A is undoped. Alternatively, a portion of the first interposing layer 35A near the second interposing layer 35B may be doped with the n-type dopant at a concentration similar to that of the n-side barrier layer 31 and the second interposing layer 35B, while the rest of the first interposing layer 35A may be doped at a lower concentration. In the above, "a portion of the first interposing layer 35A near the second interposing layer 35B" is preferably a portion of the first interposing layer 35A within a distance of 10 nm or less from the interface between the first interposing layer 35A and the second interposing layer 35B.

In another example of the interposing layer 35, the composition of the first interposing layer 35A is graded. In the case of composition-grading, a preferable structure has band-gap energies decreasing from a distal side toward a proximate side to the well layer 32A. With this structure, the height of the barrier to the electrons from the n-side semiconductor layer 2 can be decreased in the first interposing layer 35A. Accordingly, the driving voltage of the semiconductor laser element 100 can be further reduced. The band-gap energy of the first interposing layer 35A at a portion proximate to the n-side barrier layer 31 can be smaller than the band-gap energy of the n-side barrier layer 31. A plurality of sets of the first interposing layer 35A and the second interposing layer 35B may be provided, but with the plurality of sets, the height of the barrier to the electrons from the n-side semiconductor layer 2 tends to increase. Thus, a single set of the first interposing layer 35A and the second interposing layer 35B is preferable.

P-Side Barrier Layer 34

In the case of providing a p-side composition-graded layer 41 to be described below, the p-side barrier layer 34 having a band-gap energy greater than the smallest band-gap energy of the p-side composition-graded layer 41 is preferably arranged between the p-side composition-graded layer 41 and the well layers 32A, 32B. If the n-type dopant is contained in the p-side barrier layer 34, optical absorption and/or trapping of the holes may result. Also, Mg, which is a p-type dopant, produces a deep-level and induces absorption of light, so that the p-side barrier layer 34 is preferably made of undoped. For example, the p-side barrier layer 34 is made of undoped GaN.

P-Side Semiconductor Layer 4

The p-side semiconductor layer 4 can have a multilayer structure made of nitride semiconductors such as GaN, InGaN, and AlGaN. Examples of p-type semiconductor layer included in the p-side nitride semiconductor layer 4 include a layer made of a nitride semiconductor containing a p-type dopant such as Mg. The p-side semiconductor layer 4 preferably include an electron barrier layer 42 having a band-gap energy greater than that of the intermediate barrier layer 33, and the p-side composition-graded layer 41 arranged between the active layer 3 and the electron barrier layer 42. The semiconductor laser element 100 shown in FIG. 1 has a p-side semiconductor layer 4 that includes, from the active layer 3 side, the p-side composition-graded layer 41, the electron barrier layer 42, a first p-type semiconductor layer 43, and a second p-type semiconductor layer 44.

P-Side Composition-Graded Layer 41

The p-side composition-graded layer 41 has band-gap energies increasing upward. In other words, the p-side composition-graded layer 41 has a third surface 41a at the active layer 3 side and a fourth surface 41b at the electron barrier layer 42 side, and the band-gap energy of the p-side composition-graded layer 41 increases from the third surface 41a toward the fourth surface 41b. The band-gap energy of the third surface 41a side is smaller than that of the fourth surface 41b side. That is, in the p-side composition-graded layer 41, the band-gap energies increase stepwise from the third surface 41a toward the fourth surface 41b. By providing not only the composition-graded layer 26 but also the p-side composition-graded layer 41, light can be confined from both sides to the active layer 3 in good balance. Accordingly, an electric field intensity in the active layer 3 can be enhanced and the threshold current can be reduced. The p-side composition-graded layer 41 is preferably designed to have a composition, a composition change ratio, a thickness, and so forth, that are symmetric to the composition-graded layer 26 at the both sides of the active layer 3.

The p-side composition-graded layer 41 is undoped, or the concentration of a p-type dopant is $5 \times 10^{17}/cm^3$ or less. Similarly to that of the p-side barrier layer 34, the p-side composition-graded layer 41 preferably an undoped layer. The p-side barrier layer 34 serves as a p-side optical guide layer, for example. The p-side composition-graded layer 41 may employ the composition, the composition change ratio, and the thickness of preferable ranges that are similar to those in the composition-graded layer 26. The p-side composition-graded layer 41 has a thickness of preferably about 350 nm or less, more preferably about 300 nm or less. The third surface 41a side of the p-side composition-graded layer 41 preferably has a band-gap energy smaller than that of the p-side barrier layer 34, and for example, made of InGaN. The fourth surface 41b side of the p-side composition-graded layer 41 may have a band-gap energy similar to or greater than the p-side barrier layer 34, and for example, made of GaN. The p-side composition-graded layer 41 can reduce overflow of the electrons while attracting light to the active layer 3, so that it is effective to substantially monotonically decrease the In composition from the active layer 3 side.

Electron Barrier Layer 42

The electron barrier layer 42 contains a p-type dopant such as Mg. The electron barrier layer 42 is made of, for example AlGaN, for example. The electron barrier layer 42 may be provided as a layer having a highest band-gap energy in the p-side semiconductor 4 and a smaller thickness than the p-side composition-graded layer 41.

First P-Type Semiconductor Layer 43, Second P-Type Semiconductor Layer 44

Each of the first p-type semiconductor layer 43 and second p-type semiconductor layer 44 contains a p-type dopant. The first p-type semiconductor layer 43 is made of, for example, AlGaN. The first p-type semiconductor layer 43 may serve, for example, as a p-type cladding layer and has the second highest band-gap energy next to the electron barrier layer 42 in the p-side semiconductor layer 4. The first p-type semiconductor layer 43 has a thickness greater than that of the electron barrier layer 42. The second p-type semiconductor layer 44 is, for example, made of GaN, and serves as a p-type contact layer.

Insulating Layer 5, N-Electrode 8, P-Electrode 6, P-Side Pad Electrode 7

The insulating layer 5 can be a single layer or a multilayer of oxides or nitrides of Si, Al, Zr, Ti, Nb, Ta, or the like. The n-electrode 8 can be provided, for example, on an approximately entire lower surface of the n-type substrate 1. The p-electrode 6 is provided, for example, at least on an upper surface of the ridge 4a. In the case where the p-electrode 6 has a smaller width, a p-side pad electrode 7 having a width greater than that of the p-electrode 6 is provided, and a wire or the like may be connected to the p-side pad electrode 7. Examples of the materials of each electrode include a single layer or a multilayer made of one or more metals such as Ni, Rh, Cr, Au, W, Pt, Ti, and Al or an alloy of those metals, a conductive oxide containing at least one selected from Zn, In, and Sn. Examples of conductive oxides include Indium Tin Oxide (ITO), Indium Zinc Oxide (IZO), and Gallium-doped Zinc Oxide (GZO). The electrodes have a thickness, usually, that allows to serve as electrodes of a semiconductor element. The thickness may be, for example, in a range of about 0.1 μm to about 2 μm.

Method of Manufacturing Semiconductor Laser Element 100

A method of manufacturing a semiconductor laser element 100 according to the first embodiment includes steps described below. In a step of forming a composition-graded layer 26, compositions are adjusted so that band-gap energies decrease upward from a lower side that is starting side of growing to an upper side that is finishing side of growing, then, while supplying a source of an n-type dopant so that the n-type dopant is added in a concentration in a range of greater than $5 \times 10^{17}/cm^3$ and equal or less than $2 \times 10^{18}/cm^3$, a composition-graded layer 26 is formed. Then, an n-side barrier layer 31 is formed, which is in contact with an upper surface of the composition-graded layer 26 and has a band-gap energy greater than the upper surface of the composition-graded layer 26, and has a greater n-type dopant concentration and a smaller thickness than that of the composition-graded layer 26. In a subsequent step, one or more well layers 32A, 32B is formed above an n-side barrier layer 31, and a p-side semiconductor layer 4 is formed above the well layers 32A, 32B.

In addition to those layers, one or more other layers described above may be appropriately grown. Each of the layers may be epitaxially grown on a substrate 1 by using metal organic chemical vapor deposition (MOCVD) method, for example. The dopant concentration, the composition, the thickness, or the like, each described above may also be used as setting values in the method of manufacturing the semiconductor laser element 100. For example, in the step of forming the composition-graded layer 26, the composition-graded layer 26 is formed with adjusting flow ratio of source gases so that band-gap energy substantially monotonically decreases as the composition-graded layer 26 grows. In the step of forming the composition-graded layer 26, a plurality of source gases may be used. Specifically, in the step of forming the composition-graded layer 26, growing is started with $In_bGa_{1-b}N$ (0≤b) and finished with $In_aGa_{1-a}N$ (b<a<1), and increasing amount of flow ratio of In source gas with respect to Ga source gas is changed a plurality of times while growing the composition-graded layer 26. In the step of forming the composition-graded layer 26, the source of the n-type dopant is supplied substantially constantly from the start of growing to the finish of growing the composition-graded layer 26. For the source of the n-type dopant, a gas containing a material to be an n-type dopant, for example, a silane gas can be used.

In the step of forming the p-side composition-graded layer 41, the p-side composition-graded layer 41 is preferably formed in a reverse manner to the step of forming the composition-graded layer 26. That is, in the step of forming the p-side composition-graded layer 41, the p-side composition-graded layer 41 is formed with adjusting flow ratios of source gases so that band-gap energy substantially monotonically increases as the p-side composition-graded layer 41 grows. In the step of forming the p-side composition-graded layer 41, a plurality of source gases may be used. Specifically, in the step of forming the p-side composition-graded layer 41, growing is started with $In_bGa_{1-b}N$ (0≤b) and finished with $In_aGa_{1-a}N$ (b<a<1), and increasing amount of flow ratio of In source gas with respect to Ga source gas is changed a plurality of times while growing the p-side composition-graded layer 41.

EXAMPLES

Example 1

A semiconductor laser element according to Example 1 shown below was prepared. A MOCVD reactor was used for manufacturing of an epitaxial wafer for semiconductor laser elements. For the source materials, trimethylgallium (TMG), triethylgallium (TEG), trimethylaluminum (TMA), trimethylindium (TMI), ammonia ($NH_3$), silane gas, and bis(cyclopentadienyl)magnesium ($Cp_2Mg$) were appropriately used.

On a c-plane GaN substrate, $Al_{0.02}Ga_{0.98}N$ layer containing Si was grown with a thickness of 1.0 μm.

Next, $Al_{0.08}Ga_{0.92}N$ layer containing Si was grown with a thickness of 250 nm.

Next, $In_{0.04}Ga_{0.96}N$ layer containing Si was grown with a thickness of 150 nm.

Next, $Al_{0.08}Ga_{0.92}N$ layer containing Si was grown with a thickness of 300 nm.

Next, GaN layer containing Si was grown with a thickness of 650 nm.

Next, a composition-graded layer (n-side composition-graded layer) doped with Si at a concentration of about $1\times10^{18}/cm^3$ was grown with a thickness of 230 nm.

The composition-graded layer was grown started with GaN and finished with $In_{0.06}Ga_{0.94}N$, in which the In composition is monotonically increased by 120 steps to obtain substantially linear composition gradient. That is, the composition-graded layer was grown with a greater increase ratio of the flow ratio of the TMI gas toward the end of the growth. Meanwhile, the flow ratio of the TEG gas was controlled to be constant. Thus, the composition-graded layer was grown with the settings so that the In composition ratio substantially monotonically increases, in which the In composition ratio increases in a ratio of 0.02 to 0.09 (an average of 0.05%) at every growth in a thickness of 1.9 nm.

Next, a GaN layer (n-side barrier layer) doped with Si at a concentration of about $3\times10^{19}/cm^3$ was grown with a thickness of 3 nm.

Next, an undoped $In_{0.25}Ga_{0.75}N$ layer (well layer) was grown with a thickness of 2.7 nm.

Next, an undoped GaN layer was grown with a thickness of 3.4 nm.

Next, an undoped $In_{0.25}Ga_{0.75}N$ layer (well layer) was grown with a thickness of 2.7 nm.

Next, an undoped GaN layer was grown with a thickness of 2.2 nm.

Next, an undoped composition-graded layer (p-side composition-graded layer) was grown with a thickness of 230 nm.

The p-side composition-graded layer was grown started with GaN and finished with $In_{0.06}Ga_{0.94}N$, in which the In composition is substantially monotonically increased by 120 steps to obtain approximately linear composition gradient. That is, the p-side composition-graded layer was grown with a greater decrease ratio of the flow ratio of the TMI gas toward the end of the growth. Meanwhile, the flow ratio of the TEG gas was controlled to be constant. Thus, the p-side composition-graded layer was grown with the settings so that the In composition ratio substantially monotonically decreases, in which the In composition ratio decreases in a ratio of 0.02 to 0.09 (an average of 0.05%) at every growth in a thickness of 1.9 nm.

Next, $Al_{0.16}Ga_{0.84}N$ layer containing Mg was grown with a thickness of 11 nm.

Next, $Al_{0.04}Ga_{0.96}N$ layer containing Mg was grown with a thickness of 300 nm.

Next, a GaN layer containing Mg was grown with a thickness of 15 nm.

Figure 7:
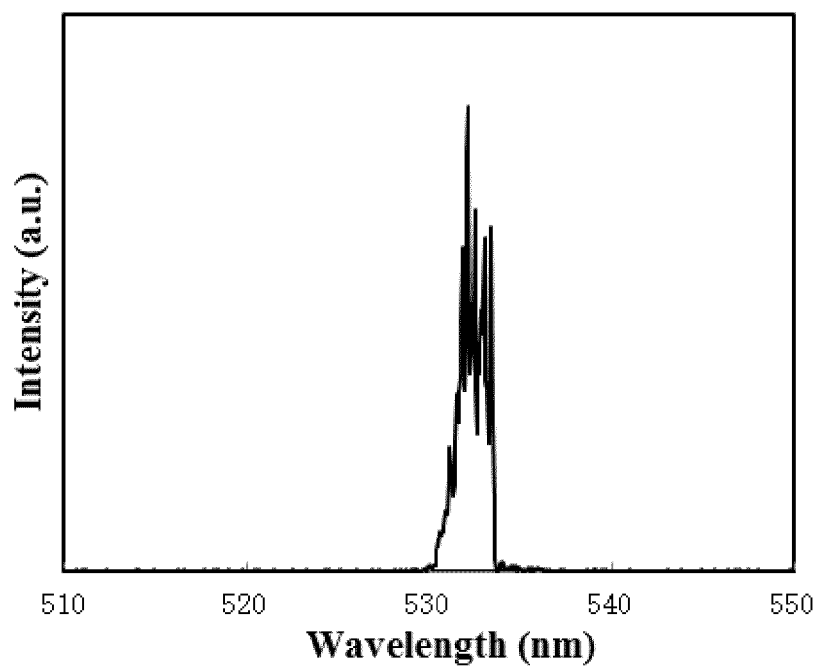
FIG. 7 is a graph showing an emission spectrum of a semiconductor laser element according to Example 1.

The epitaxial wafer with the layers grown thereon was removed from the MOCVD reactor, and then, a ridge, a p-electrode, an n-electrode, or the like are formed corresponding to each semiconductor element by using photolithography, RIE, and sputtering, then singulated to obtain each of the semiconductor laser elements. Each of the semiconductor laser elements was formed with a ridge width of 15 μm, a cavity length of 1200 μm, and a device width of 150 μm. In FIG. 7, a wavelength spectrum of the semiconductor laser element according to Example 1 is shown. As shown in FIG. 7, the semiconductor laser element according to Example 1 emitted light at 532 nm.

Comparative Example 1

In Comparative Example 1, a semiconductor laser element was fabricated in a similar manner as in Example 1, except that the n-side composition-graded layer was grown undoped.

Result of Experiment 1

Figure 8:
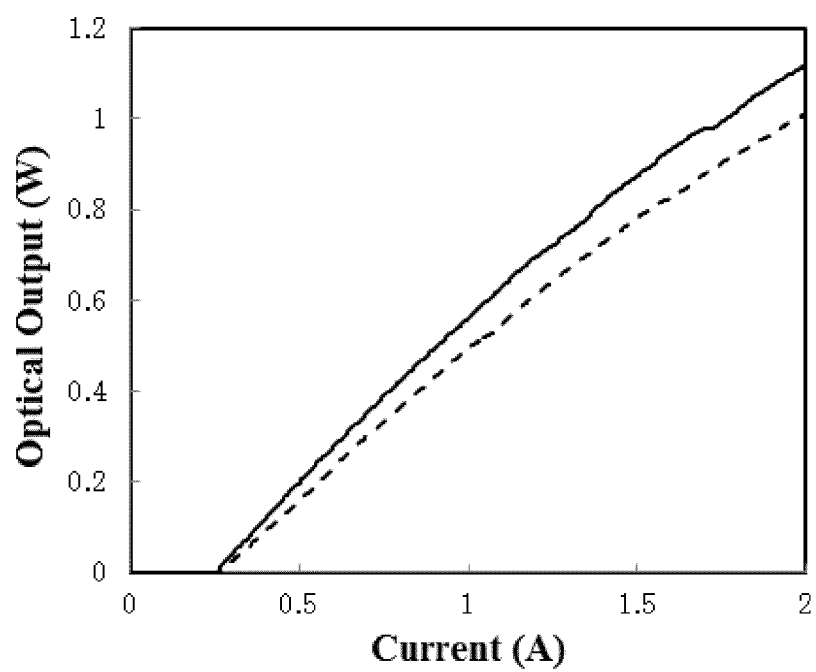
FIG. 8 is a graph showing I-L characteristics of the semiconductor laser elements according to Example 1 and Comparative Example 1.
Figure 9:
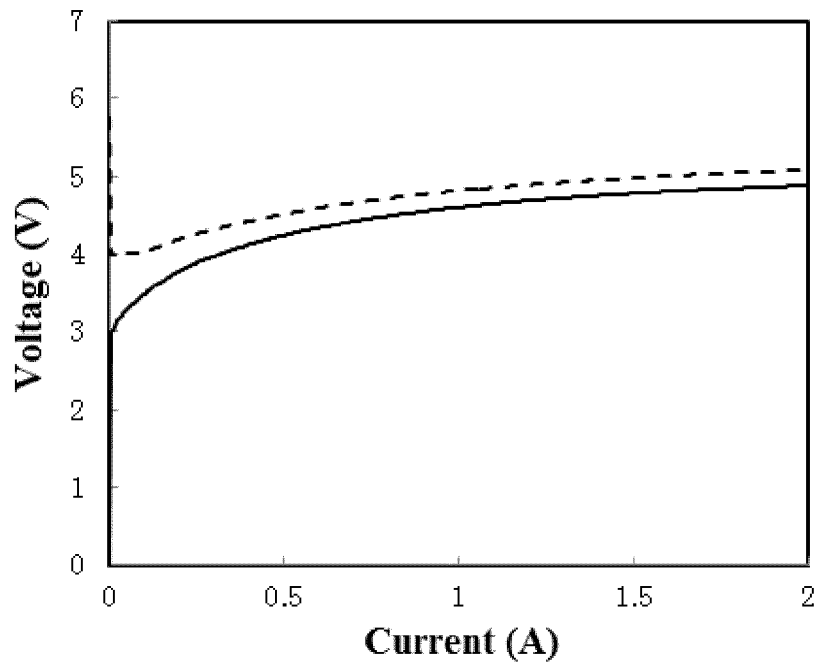
FIG. 9 is a graph showing I-V characteristics of the semiconductor laser elements according to Example 1 and Comparative Example 1.

The I-L characteristics of the semiconductor laser elements according to Example 1 and Comparative Example 1 are shown in FIG. 8, and the I-V characteristics thereof are shown in FIG. 9. In FIG. 8 and FIG. 9, solid lines represent the semiconductor laser element of Example 1, and broken lines represent the semiconductor laser element of Comparative Example 1. As shown in FIG. 8 and FIG. 9, the semiconductor laser element of Example 1 exhibited an improvement in the optical output and a decrease in the voltage compared to those of the Comparative Example 1. The higher voltage exhibited by the semiconductor laser element of Comparative Example 1 is assumed that fixed charges occurred intermittently in the n-side composition-graded layer as described above, which required sufficient amount of injection of current and applying of voltage to shield such fixed charges. Doping an n-type dopant in the n-side composition-graded layer allows for supply of electrons from the n-type dopant to shield the fixed charges. The reduction in the operation voltage in the semiconductor laser element of Example 1 is assumed according to the above. The improvement in the optical output is assumed due to an improvement in carrier injection to the active layer obtained by shielding of fixed charges that occurred in the n-side composition-graded layer. In the n-side composition-graded layer, that is, in the undoped n-side composition-graded layer, of Comparative Example 1, the concentration of Si is assumed to be less than $1 \times 10^{17}/cm^3$.

Example 2

In Example 2, a semiconductor laser element was fabricated in a similar manner as in Example 1, except that the n-side composition-graded layer was grown with a Si doped-concentration of about $2 \times 10^{18}/cm^3$. That is, the Si concentration in the n-side composition-graded layer of Example 2 was about twice of that in the n-side composition-graded layer of Example 1.

The semiconductor laser element of Example 2 exhibited a low voltage value similar to that of the semiconductor laser element of Example 1. This is assumed that because Si is doped in the n-side composition-graded layer, which is different from that in Comparative Example 1, shielding of the fixed charges and injection of carriers were improved, leading to a decrease in the rising voltage and driving voltage. Whereas the optical output was lower in Example 2 than in Example 1, and similar to that in Comparative Example 1. This is assumed that because the concentration of Si in the n-side composition-graded layer was increased in Example 2 than in Example 1, absorption loss due to free carriers increased.

Figure 10:
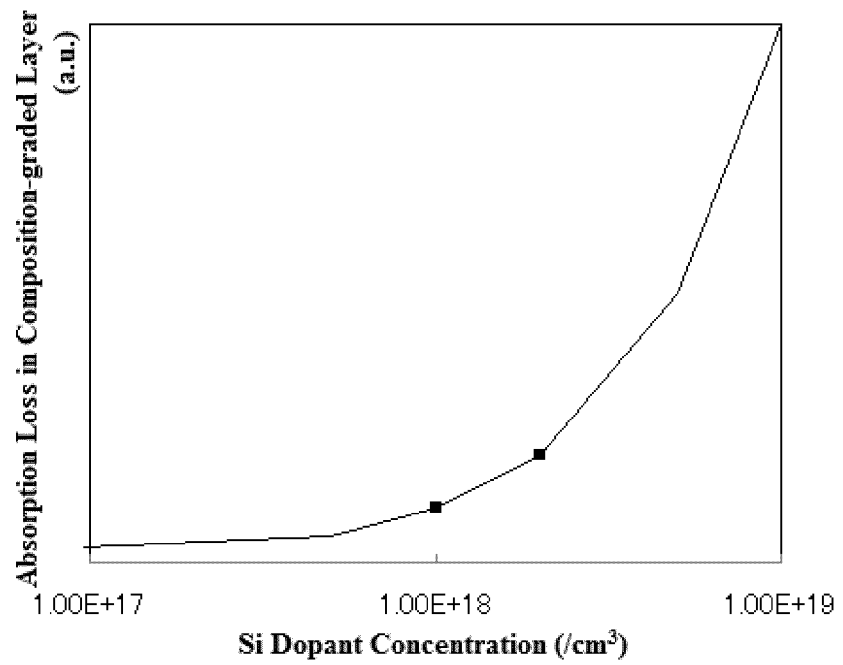
FIG. 10 is a graph depicting a relationship between dopant concentration and free carrier absorption loss in the composition-graded layer.

FIG. 10 is a graph depicting a relationship between dopant concentration and free carrier absorption loss in the composition-graded layer. The values shown in FIG. 10 were obtained by calculation. Loss a due to free carriers in a dopant-containing layer depends on the carrier density. That is, an increase in the carrier density increases loss due to free carrier absorption. The carrier density increases with an increase in the Si concentration. Thus, in the semiconductor laser element of Example 2 with a greater carrier density due to a greater Si concentration, an increase in the loss and a decrease in the optical output were assumed to result. It is assumed that, as shown in FIG. 10, if the Si concentration in the n-side composition-graded layer exceeds $2 \times 10^{18}/cm^3$, the absorption loss further increases and the optical output significantly decreases. Since the I-V characteristics were similar in Example 1 and Example 2, the Si concentration to reduce the voltage is thought to be sufficient at about $1 \times 10^{18}/cm^3$.

Example 3

In Example 3, a semiconductor laser element was fabricated in a similar manner as in Example 1, except that the n-side composition-graded layer was grown with a growth end of $In_{0.05}Ga_{0.95}N$. That is, the Si doping concentration of the n-side composition-graded layer was $1 \times 10^{18}/cm^3$. The semiconductor laser element according to Example 3 emitted light at about 532 nm.

Example 4

In Example 4, a semiconductor laser element was fabricated in a similar manner as in Example 3, except that the n-side composition-graded layer was grown with a Si doped-concentration of about $7 \times 10^{17}/cm^3$. The semiconductor laser element according to Example 4 emitted light at about 532 nm.

Comparative Example 2

In Comparative Example 2, a semiconductor laser element was fabricated in a similar manner as in Example 3, except that the n-side composition-graded layer was grown with a Si doped-concentration of about $3 \times 10^{17}/cm^3$. The semiconductor laser element according to Comparative Example 2 emitted light at about 532 nm.

Result of Experiment 2

Figure 11:
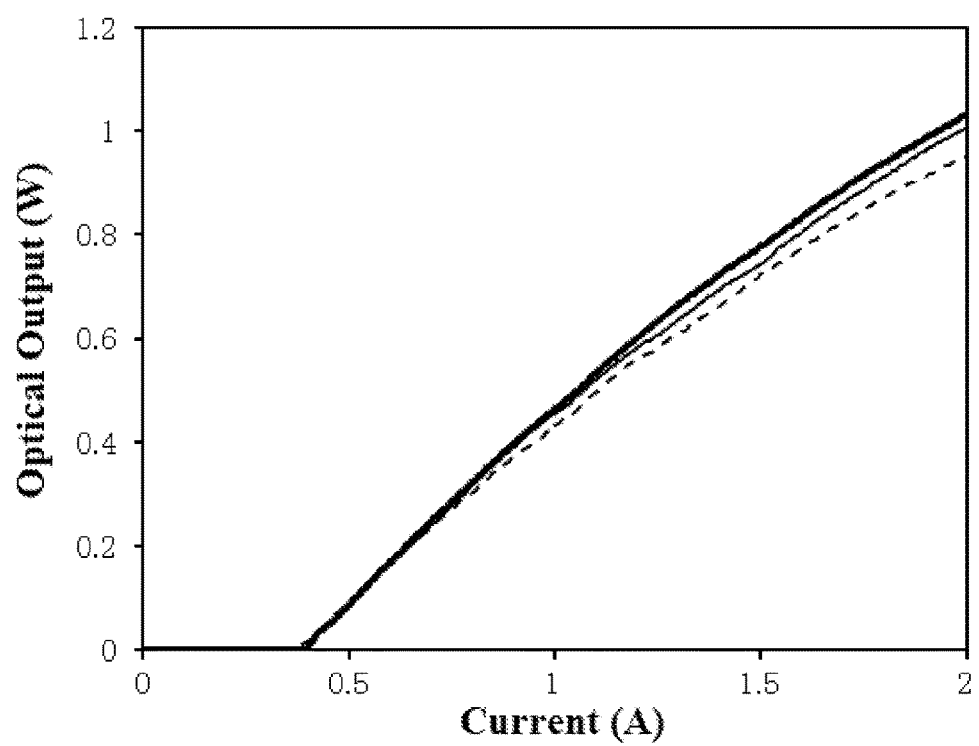
FIG. 11 is a graph showing I-L characteristics of the semiconductor laser elements according to Examples 3, 4 and Comparative Example 2.
Figure 12:
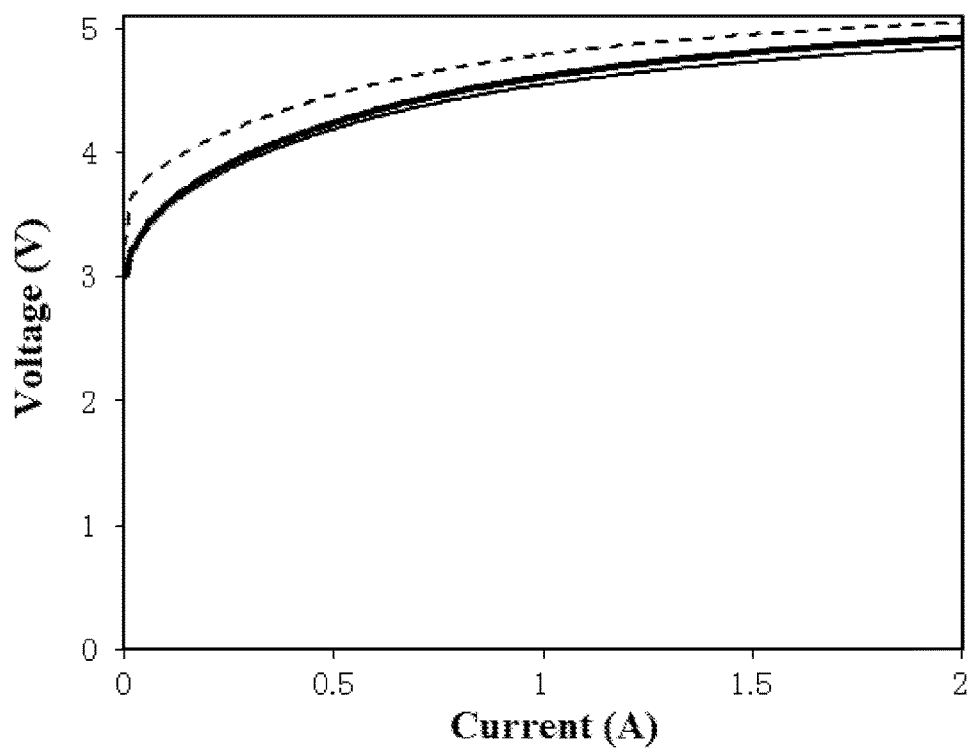
FIG. 12 is a graph showing I-V characteristics of the semiconductor laser elements according to Examples 3, 4 and Comparative Example 2.

FIG. 11 is a graph showing I-L characteristics of semiconductor laser elements according to Examples 3, 4 and Comparative Example 2, and the I-V characteristics thereof are shown in FIG. 12. In FIG. 11 and FIG. 12, thin solid lines represent the semiconductor laser element of Example 3, thick solid lines represent the semiconductor laser element of Example 4, and broken lines represent the semiconductor laser element of Comparative Example 2. As shown in FIG. 11 and FIG. 12, the semiconductor laser element of Examples 3 and 4 exhibited an improvement in the optical output and a decrease in the voltage compared to those of the Comparative Example 2.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A semiconductor laser element comprising:
   an n-side semiconductor layer, an active layer, and a p-side semiconductor layer, layered upward in this order, each being made of a nitride semiconductor;
   wherein the active layer includes one or more well layers, and an n-side barrier layer located lower than the one or more well layers;
   wherein the n-side semiconductor layer includes a composition-graded layer located in contact with the n-side barrier layer;
   wherein the composition-graded layer has a band-gap energy that decreases toward an upper side of the composition-graded layer, with a band-gap energy of the upper side being smaller than a band-gap energy of the n-side barrier layer;

wherein the composition-graded layer has an n-type dopant concentration greater than $5\times10^{17}/\text{cm}^3$ and less than or equal to $2\times10^{18}/\text{cm}^3$; and wherein the n-side barrier layer has an n-type dopant concentration greater than that of the composition-graded layer and a thickness smaller than that of the composition graded layer.

2. The semiconductor laser element according to claim 1, wherein the n-type dopant concentration in the composition-graded layer is substantially uniform in an up/down direction of the layer.

3. The semiconductor laser element according to claim 1, wherein the active layer includes a plurality of well layers and at least one intermediate barrier layer, each intermediate barrier layer being interposed between respective well layers;

wherein the p-side semiconductor layer includes an electron barrier layer having a greater band-gap energy than the at least one intermediate barrier layer, and a p-side composition-graded layer located between the active layer and the electron barrier layer and having a band-gap energy that increases toward an upper side of the p-side semiconductor layer; and wherein the p-side composition-graded layer is undoped or doped with a p-type dopant at a concentration of $5\times10^{17}/\text{cm}^3$ or less.

4. The semiconductor laser element according to claim 1, wherein the composition-graded layer has a thickness of 200 nm or greater.

5. The semiconductor laser element according to claim 1, wherein the composition-graded layer is made of a plurality of sub-layers of $\text{In}_x\text{Ga}_{1-x}\text{N}$ with different compositions, and an uppermost sub-layer of the composition-graded layer is made of $\text{In}_a\text{Ga}_{1-a}\text{N}$ (0<a<1), and a lowermost sub-layer of the composition-graded layer is made of $\text{In}_b\text{Ga}_{1-b}\text{N}$ (0≤b<a).

6. The semiconductor laser element according to claim 5, wherein each of the sub-layers has a thickness of 25 nm or less.

7. The semiconductor laser element according to claim 6, wherein a difference in an In composition ratio x between adjacent sub-layers is 0.005 or less.

8. The semiconductor laser element according to claim 1, wherein a distance between the composition-graded layer and a closest one of the one or more well layers is 20 nm or less.

9. The semiconductor laser element according to claim 1, wherein the n-side barrier layer has a thickness of 20 nm or less and an n-type dopant concentration of $1\times10^9/\text{cm}^3$ or greater.

10. The semiconductor laser element according to claim 1, wherein the active layer comprises, between the n-side barrier layer and the one or more well layers, a first interposing layer having a band-gap energy smaller than the band-gap energy of the n-side barrier layer, and a second interposing layer having a band-gap energy greater than the band-gap energy of the first interposing layer, in this order from the n-side barrier layer.

11. The semiconductor laser element according to claim 10, wherein the first interposing layer has a thickness of 100 nm or less, the second interposing layer has a thickness of 10 nm or less, and the n-side barrier layer has a thickness of 10 nm or less.

12. The semiconductor laser element according to claim 10, wherein each of the first interposing layer and the second interposing layer contains an n-type dopant.

13. The semiconductor laser element according to claim 1, wherein the n-side barrier layer is made of GaN.

14. The semiconductor laser element according to claim 1, wherein the semiconductor laser element is configured to emit laser light with a wavelength of 530 nm or greater.

15. A semiconductor laser element comprising:

an n-side semiconductor layer, an active layer, and a p-side semiconductor layer, layered upward in this order, each being made of a nitride semiconductor;

wherein the active layer includes a plurality of well layers, an n-side barrier layer located lower than the well layers, and an intermediate barrier layer located between at least two of the well layers;

wherein the n-side semiconductor layer includes a composition-graded layer located in contact with the n-side barrier layer;

wherein the composition-graded layer has band-gap energy that decreases toward an upper side of the composition-graded layer, with a band-gap energy of the upper side being smaller than a band-gap energy of the n-side barrier layer;

wherein the composition-graded layer contains an n-type dopant;

wherein an n-type dopant concentration of the n-side barrier layer is greater than an n-type dopant concentration of the composition-graded layer, and a thickness of the n-type barrier layer is smaller than a thickness of the composition-graded layer; and wherein the p-side semiconductor layer includes:

an electron barrier layer having a band-gap energy greater than a band-gap energy of the intermediate barrier layer, and a p-side composition-graded layer between the active layer and the electron barrier layer and having a band-gap energy that increases toward an upper side of the p-side composition-graded layer; and wherein the p-side composition-graded layer is undoped or doped with a p-type dopant at a concentration of $5\times10^{17}/\text{cm}^3$ or less.

16. The semiconductor laser element according to claim 15, wherein the n-side barrier layer has a thickness of 20 nm or less and an n-type dopant concentration of $1\times10^9/\text{cm}^3$ or greater.

17. A method of manufacturing a semiconductor laser element comprising:

forming a composition-graded layer by adjusting compositions within the composition-graded layer such that a band-gap energy of the composition-graded layer decreases from a lower side, at which growth begins, toward an upper side, at which growth is finished, and supplying a source of an n-type dopant such that the n-type dopant is added in a concentration greater than $5\times10^{17}/\text{cm}^3$ and less than or equal to $2\times10^{18}/\text{cm}^3$;

forming an n-side barrier layer that is in contact with an upper surface of the composition-graded layer, the n-side barrier layer having a band-gap energy greater than that of the upper surface of the composition-graded layer, and having a greater n-type dopant concentration and a smaller thickness than that of the composition-graded layer;

forming one or more well layers above the n-side barrier layer; and forming a p-side semiconductor layer above the one or more well layers.

18. The method of manufacturing a semiconductor laser element according to claim 17, wherein, in the step of forming the composition-graded layer, the composition-graded layer is formed by adjusting composition ratios such that a band-gap energy of the composition-graded layer substantially monotonically decreases as the composition-graded layer grows.

19. The method of manufacturing a semiconductor laser element according to claim 18, wherein, in the step of forming the composition-graded layer, growing is started with $In_bGa_{1-b}N$ ($0 \leq b$) and finished with $In_aGa_{1-a}N$ ($b<a<1$), and a flow ratio of In source gas with respect to Ga source gas is increased a plurality of times while growing the composition-graded layer.

20. The method of manufacturing a semiconductor laser element according to claim 17, wherein in the step of forming the composition-graded layer, the source of the n-type dopant is supplied substantially constantly from the start of growing to the finish of growing the composition-graded layer.

* * * * *